US007310002B2

United States Patent
Iguchi

(12) United States Patent
(10) Patent No.: US 7,310,002 B2
(45) Date of Patent: Dec. 18, 2007

(54) MOTOR INSPECTION METHOD

(75) Inventor: Takuro Iguchi, Kyoto (JP)

(73) Assignee: Nidec Corporation, Kyoto (JP)

( * ) Notice: Subject to any disclaimer, the term of this patent is extended or adjusted under 35 U.S.C. 154(b) by 176 days.

(21) Appl. No.: 11/306,864

(22) Filed: Jan. 13, 2006

(65) Prior Publication Data

US 2006/0208723 A1 Sep. 21, 2006

(30) Foreign Application Priority Data

Jan. 13, 2005 (JP) ............................. 2005-006155
Dec. 28, 2005 (JP) ............................. 2005-377002

(51) Int. Cl.
*G01R 31/34* (2006.01)

(52) U.S. Cl. .................................... 324/772

(58) Field of Classification Search ................ 324/772, 324/765, 158.1; 318/432, 478, 479, 490; 310/217, 168, 166; 29/732; 720/698; 73/483, 73/116

See application file for complete search history.

(56) References Cited

U.S. PATENT DOCUMENTS 4,204,425 A * 5/1980 Mallick, Jr. ............... 73/116
4,562,390 A * 12/1985 Tobise ...................... 318/490
4,991,429 A * 2/1991 Stacey et al. ............. 73/116

FOREIGN PATENT DOCUMENTS

JP 2003-228959 A 8/2003
JP 2004-264291 A 9/2004

OTHER PUBLICATIONS

T. Kenjo, et al., "Brushless Motors," Sogo Electronics Press, 2003, pp. 9-10.

* cited by examiner

*Primary Examiner*—Ha Tran Nguyen
*Assistant Examiner*—Tung X. Nguyen
(74) *Attorney, Agent, or Firm*—Volentine & Whitt, PLLC

(57) ABSTRACT

A method of measuring the counter-electromotive force of the motor accurately is disclosed. The counter-electromotive force of the motor changes with the rotational position and the rotational speed. The value of the counter-electromotive force measured during the inertial rotation is a value associated the simultaneous change of the rotational position and the rotational speed and required to be corrected. The change rate of the rotational speed is set as a deceleration function, and the data are statistically processed using the measurement value of the counter-electromotive force at minuscule time intervals. In this way, the error elements are eliminated for each motor measured thereby to determine the corrected counter-electromotive force at a predetermined rotational speed. Even a miniature motor rapidly decreased in speed can be accurately measured within a short time.

19 Claims, 6 Drawing Sheets

MOTOR INSPECTION METHOD

BACKGROUND OF THE INVENTION

1. Field of the Invention

This invention relates to a method of inspecting the counter-electromotive force of a motor, or in particular to a method of correcting the measurement value of the counter-electromotive force generated across coils during the inertial rotation of the motor to the value of the counter-electromotive force generated at the time of the rotation at a predetermined rotational speed.

2. Description of the Related Art

The motor is an indispensable energy converter in the current society, which makes possible the mutual conversion between the electric energy and the kinetic rotational energy. The motor of various sizes are available ranging from as small as several millimeters to as large as more than one meter in diameter and finds wide applications. In the field of information technology, for example, a miniature motor is used to rotate a discal recording medium.

The motor is configured of a permanent magnet and coils wound in opposed relation to the magnetic poles of the permanent magnet. The permanent magnet makes up one of a rotor and a stator, and the coils the other. The rotor is supported rotatably on the stator. Upon energization of the coils, an induction magnetic field is generated, and the rotor is rotated by the magnetic interaction with the magnetic field generated by the permanent magnet.

An important index of the motor characteristics is a torque constant. The magnetic field of the permanent magnet can be regarded to be constant with respect to the time and the rotation of the rotor. The torque generated by the motor is proportional to the current supplied to the coils, and the proportionality constant thereof is the torque constant. In similar fashion, the counter-electromotive force generated in the coils and the rotational speed of the rotor are proportional to each other, and the proportionality constant thereof is the counter-electromotive force constant. The torque constant and the counter-electromotive force constant are physically identical with each other, and the torque constant can be determined by measuring the counter-electromotive force constant.

The counter-electromotive force as referred to herein is an induced electromotive force generated in the coils by the magnetic field of the permanent magnet, and determined by measuring the potential difference across the ends of the coils or between the corresponding positions. The value of the induced electromotive force thus generated is known to be varied periodically with the relative rotational angular positions of the rotor and the stator.

In recent years, energy saving has been the demand in every field, and the need of lower power consumption of the motor has increased more and more. As described above, the torque constant (i.e. the counter-electromotive force constant) is a value indicating the energy conversion efficiency of the motor, and accurate measurement of the counter-electromotive force is crucial to accurately grasp the torque constant.

The counter-electromotive force is measured roughly by one of two methods. In one method, the motor is forcibly rotated at a predetermined rotational speed by an external drive unit, and the counter-electromotive force generated by the motor is measured. According to this method, the counter-electromotive force measured has a predetermined period, waveform and amplitude. By increasing the rotational accuracy of forcible rotation, therefore, the counter-electromotive force can be measured with a very high accuracy. In this measuring method, however, the forcible rotation of the motor by an external drive requires that the external drive unit is required to be mounted on the rotor of the motor or a rotary member on which it is mounted. In the process, fine damages, distortion or dust is liable to occur, thereby leading to the disadvantage that this measuring method cannot be used for the motor for precision equipments or the rotor fabricated of a fragile material.

The other method consists in stopping the input of the motor in steady rotation by the input current into the inertial rotation and measuring the counter-electromotive force generated in the motor by the inertial rotation. In the case where the moment of inertia around the rotational axis of the rotor and the rotary member mounted on the rotor is sufficiently large, the reduction in the rotational energy is small and therefore the reduction in the rotational speed during the inertial rotation is also so small that the motor rotates at substantially a constant rotational speed for a short length of time. The counter-electromotive force measured in the process has a substantially constant period, waveform and amplitude. In the case where the moment of inertia around the rotational axis is small, however, a large ratio of the effects of various losses immediately changes the rotational speed, and therefore the counter-electromotive force dependent to a large measure on the rotational speed and the rotational angular position cannot be accurately measured. In an extreme case, the motor is stopped before the required data is collected, and the measurement is impossible. For utilization of this method, therefore, the moment of inertia around the rotational axis is required to be sufficiently large, and this method is not applicable to the measurement of lightweight, miniature motors.

In the latter method, the reduction in rotational speed during measurement is substantially unavoidable. Therefore, the development of a method in which the change in rotational speed during measurement is properly evaluated and the counter-electromotive force is measured with high accuracy for a short length of time has been required.

BRIEF SUMMARY OF THE INVENTION

This invention has been achieved in view of the problem of the prior art described above and the object thereof is to provide a method of measuring the counter-electromotive force with high accuracy regardless of the magnitude of reduction in rotational speed of the motor inertially rotated by stopping the input without mounting any external drive unit on the rotor of the motor or a rotary member mounted thereon.

The method of inspecting the counter-electromotive force according to the invention is applicable to a motor comprising a permanent magnet and coils wound with coil lead wires, which selected one of the permanent magnet and the coils makes up a stator, and the other makes a rotor rotated relative to the stator. In this inspection method, the relation between the time elapsed and the amount of reduction in rotational speed during the inertial rotation is measured or estimated in advance for at least one motor thereby to determine the deceleration function. Further, as a first step, the terminals of the coil lead wires of each motor are electrically connected to a power supply, so that the rotor is rotated at a predetermined rotational speed with respect to the stator. Then, as a second step immediately after the first step, the coil lead wires and the power supply are electrically disconnected, the rotor is rotated inertially relative to the stator, and while the rotational speed is gradually reduced, the potential difference across the coil lead wires is measured. As a third inspection step, the measurement value of the potential difference is corrected based on the deceleration function determined, and the value of the counter-electromotive force is determined in the constant rotation mode at a specified rotational speed.

This inspection method makes it possible to stably and accurately measure the counter-electromotive force of any motor regardless of the magnitude of the reduction in rotational speed. In the second step, the correction for the second and third steps can be carried out at the same time.

As one desirable method, assume that θ is the relative rotational angular position of the motor rotor based on the coils, and t the time elapsed from a reference time point. Also, the rotational resistance reducing the rotational speed of the inertial rotation is primarily proportional to the rotational angular speed, and the deceleration function is set on the assumption that the proportionality constant thereof is λ. Then, the equation of motion of the inertial rotation of the motor rotor is given as $$\frac{d^2\theta}{dt^2} = -\lambda\frac{d\theta}{dt} \quad (1)$$

Equation 1 can be easily resolved either by the stoichiometric method or the numerical analysis method. This resolution has few parameters for determination and the parameters can be accurately and easily determined.

From the measurement of the counter-electromotive force and the measurement of the elapsed time, for example, the parameter of the deceleration function unique to the motor can be determined. Further, by use of this value, the counter-electromotive force generated when the rotational angular position for measurement is reached with the motor rotor rotating at a constant rotational angular speed for measurement can be determined by corrective calculation.

In the method according to the invention, the data are collected during normal rotation mode of about one rotation, and therefore the measurement can be completed within a very short length of time. This invention is applicable, therefore, to a spindle motor for a hard disk to rotate a small-diameter disk, which spindle motor has a small moment of inertia around the rotational axis and stops within a short time thereby making a high-accuracy measurement difficult. The counter-electromotive force can be measured with high accuracy by application of this invention to this motor. Further, the number of steps and the length of time including the step of mounting the inspection jig can be reduced, and therefore the productivity is remarkably improved.

DETAILED DESCRIPTION OF THE INVENTION

Figure 1:
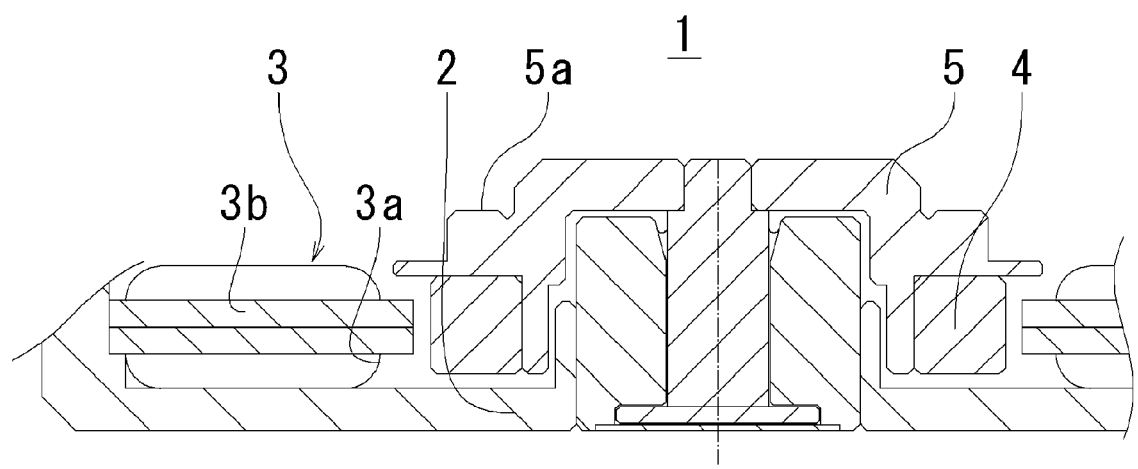
FIG. 1 is a diagram showing a spindle motor for rotating the hard disk to be inspected according to the first and second embodiments of the invention.

Best Mode for Carrying Out the Invention

Embodiments of the invention are explained below with reference to the drawings. In the description of the embodiments that follow, the words and phrases relating to the directions, i.e. "upward", "downward", "right", "left", etc. indicate only the directions as viewed in the drawings and unless otherwise specified, actual directions are not limited to them.

First Embodiment

As an inspection method according to a first embodiment of the invention, a method of inspecting a spindle motor for a hard disk is explained. FIG. 1 shows the spindle motor for the hard disk according to this embodiment.

1-1 Configuration of Spindle Motor

The spindle motor 1 is a DC brushless motor including a stator 3 having a plurality of magnetic pole teeth 3a. The magnetic pole teeth 3a are wound with coils 3b, the ends of which are connected to a drive circuit for controlling the current supplied to the coils 3b. The stator 3 is fixed on a base 2 of the spindle motor 1. An annular rotor magnet 4 is mounted at a position in diametrically opposed relation to the magnetic pole teeth 3a of the stator 3. The rotor magnet 4 is a permanent magnet with a plurality of magnetic poles magnetized to generate a magnetic field. The rotor magnet 4 is mounted on a rotor hub 5 constituting a rotary member, and rotatably supported on the stator 3 through bearings. The bearings are configured of fluid dynamic bearings.

1-2 Energy Loss of Motor

The spindle motor 1 is adapted to rotate a hard disk having a diameter of 2.5 inches, and the rotor hub 5 is formed with a disk-mounting surface 5a. The main energy losses of this spindle motor 1 include the bearing friction loss, core loss and the windage loss.

The bearing friction loss is the energy loss caused by the friction of the bearing portion. The windage loss is the energy loss caused by the rotor magnet 4 and the rotor involving the surrounding air when rotating integrally with the rotor magnet 4. The core loss is caused by the induced electromotive force or the magnetization resistance generated when magnetizing the iron core making up the magnetic pole teeth 3a of the stator 3.

Figure 2:
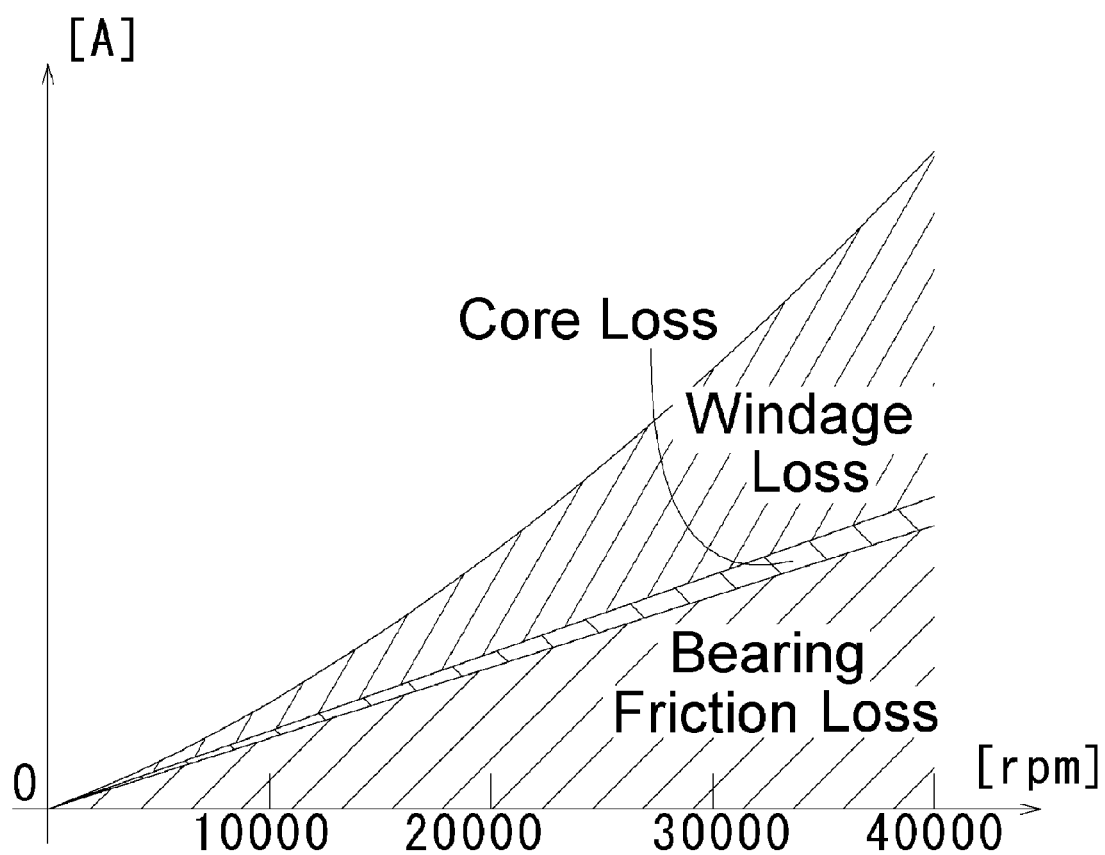
FIG. 2 is a graph showing the relation between the rotational speed and the energy loss of a spindle motor according to the first and second embodiments.

FIG. 2 is a graph showing the relation between the rotational speed and the current value (the power consumption per unit time, the source voltage being constant) of the spindle motor 1 according to this embodiment. This graph is plotted in such a manner that each current value and the corresponding one of the losses mentioned above can be identified. This graph represents the analysis with the recording disk mounted on the spindle motor 1. As compared with the inspection of the motor alone, therefore, the core loss and the bearing friction loss assume an equal value, while the windage loss is higher in value.

According to this embodiment, the iron core used for the magnetic pole teeth 3*a* is formed of silicon steel plates to facilitate magnetization and to reduce the core loss. The loss due to the magnetization, therefore, is sufficiently smaller than the other two losses. Depending on the type of the motor, the core loss is not always small, in which case the correction is required taking the effect of the core loss into account.

The recording disk 2.5 inches in diameter mounted on the rotor hub 5 of the spindle motor 1 has few roughnesses causing the windage loss, and the energy loss due to the bearing friction loss is larger for up to about 20000 rpm. The spindle motor 1 with the recording disk not mounted thereon has a still smaller windage loss. Thus, the bearing friction loss represents a greater proportion of the energy loss.

The fluid dynamic bearings are used as bearings. The bearing friction loss represents a major proportion of the loss of the motor. Also, the bearing friction loss increases in proportion to the rotational speed.

In general, for the higher rotational speeds of up to about 20,000 rpm, the energy loss increases in proportion to the rotational speed and the effect of the windage loss has a greater effect resulting in a sharp increase in energy loss. In the area of low rotational speed of not higher than 20,000 rpm, on the other hand, the windage loss and the core loss are sufficiently small according to this embodiment. Therefore, the rotation resistance and the rotational speed are considered to be substantially proportional to each other.

Based on the foregoing study, the deceleration function is set as a function primarily proportional to the rotational angular speed.

1-3 Measurement of Counter-electromotive Force

The counter-electromotive force is measured using the spindle motor 1 to be measured, and a device (such as a digital oscilloscope or a voltmeter) capable of temporally measuring the potential difference between the terminals of the spindle motor 1. A device capable of outputting the digital or analog data on the relation between the measurement time and the terminal potential difference is more conveniently used. The potential difference data measured at minuscule time intervals is analyzed by the computer to determine the required numerical values. Both manual calculation and the computer operation can of course determine a similar resolution.

As a first step, the drive circuit for controlling the current supplied to the coils 3*b* of the spindle motor 1 to be measured is turned on, and the coils 3*b* are electrically connected to a power supply. Thus, the rotor is rotated at a predetermined rotational speed with respect to the stator.

At a second step immediately after the first step, the drive circuit for controlling the current supplied to the coils 3*b* is turned off, and the coils 3*b* and the power supply are electrically disconnected. Thus, the rotor is rotated inertially with respect to the stator, and while the rotational speed gradually decreases, the potential difference across the coils 3*b* of the spindle motor 1 is measured at predetermined minuscule time intervals. According to this embodiment, the sampling rate is set to 50,000 Hz. In the case where the rotational speed is constant at 6,000 rpm, for example, 500 pieces of data can be acquired per rotation.

Figure 4A:
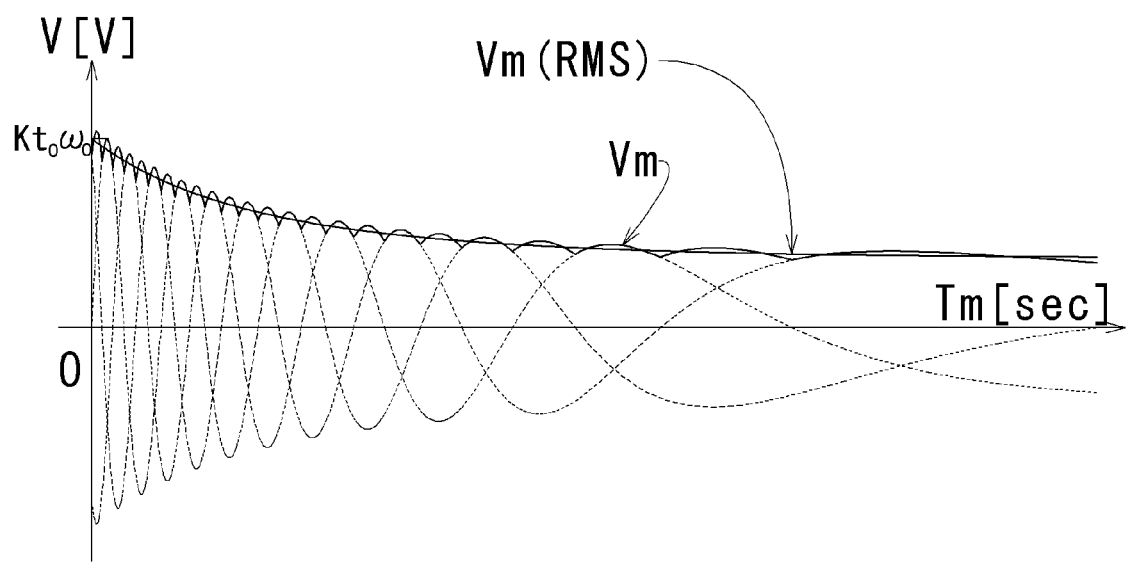
FIG. 4A is a graph showing the relation between the potential difference measurement and the elapsed time.

FIG. 4A shows the result of measurement. The measurement time is given as $T_m$, and the potential difference across the coils 3*b* as $V_m$.

According to this embodiment, the motor to be measured is a three-phase DC brushless motor having eight magnetic poles of the rotor magnet. The drive circuit has three energization modes (phases). These three phases are called U, V, W, respectively, and coils are connected in star (Y) or delta (Δ) between each two adjacent phases of three phase sets. In FIG. 4A, the terminal voltage between two phases (U-V, V-W or W-V) (hereinafter referred to as the inter-phase potential difference) is indicated by dotted line. According to this embodiment, the accuracy is improved by measuring the three terminal voltages of U-V, V-W, W-V at the same time. Nevertheless, only one terminal voltage may alternatively be measured. During normal operation, each of these phases is controlled by the drive circuit, and impressed with a source voltage of sinusoidal or rectangular waveform. The electromotive force $V_m$ designated by solid line, on the other hand, is called a rectified waveform, in which the maximum absolute value of each of the three inter-phase potential differences is plotted. In the description of this embodiment, $V_m$ designates the rectified waveform. This rectified waveform can be obtained through a waveform conversion circuit for rectifying the voltage waveform. The potential difference $V_m$ changes with time and exhibits 24 (=3 phases×8 magnetic poles) peaks per rotation of the motor. This value behaves exponentially with a periodicity and gradually approaches zero due to the decrease in rotational speed of the rotor with time. Also, as shown in the drawing, the effective value $V_m(RMS)$ of the counter-electromotive force behaves exponentially without pulsation.

Next, as a third inspection step, the measurement of the potential difference is corrected based on the deceleration function determined above, and the value of the counter-electromotive force for a predetermined rotation mode at a specified rotational speed is determined.

As shown in FIG. 2, the loss torque of the spindle motor 1 is substantially proportional to the rotational speed. The rotational angle of the rotary member is defined as θ, the elapsed time as t and the deceleration function as a function (proportionality coefficient k) primarily proportional to the rotational angular speed dθ/dt. The rotational motion due to the rotational inertia of the rotor expressed by multiplying the moment of inertia I around the rotational axis by the rotational angular acceleration $d^2θ/dt^2$ and the loss torque proportional to the rotational angular speed dθ/dt is taken into consideration. Then, the equation of motion of the motor in inertial rotation is given as $$\frac{d^2\theta}{dt^2} = -\lambda \frac{d\theta}{dt} \qquad (1)$$

where λ indicates the ratio between the moment of inertia I around the rotational axis and the proportionality coefficient k(λ=k/I). For the boundary condition of t=0, θ=0 and dθ/dt=$ω_0$, the resolution of this differential equation is determined as $$\frac{d\theta}{dt} = \omega_0 e^{-\lambda t}, \quad \theta = \frac{\omega_0}{\lambda}(1 - e^{-\lambda t}) \qquad (2)$$

Figure 3A:
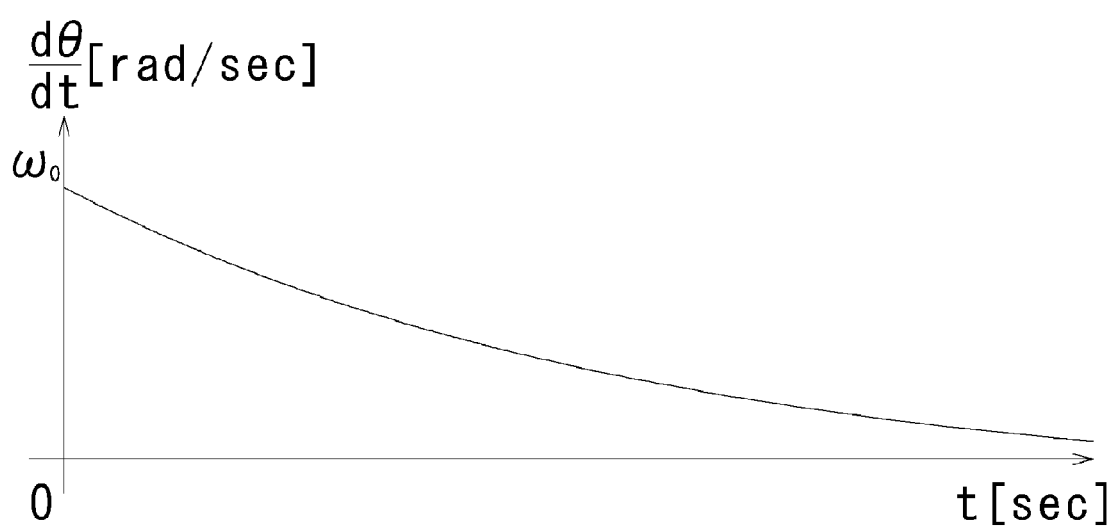
FIG. 3A is a graph showing the relation between rotational speed and time.
Figure 3B:
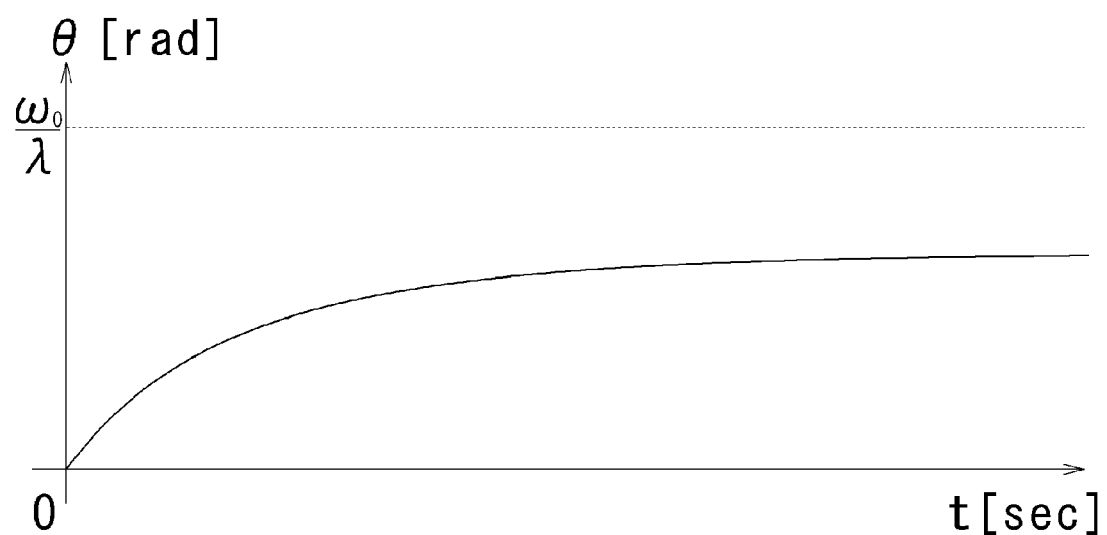
FIG. 3B is a graph showing the relation between rotational angle and time.

FIG. 3A shows the relation between the rotational angular speed dθ/dt and the elapsed time t. This indicates the manner in which the rotational angular speed decreases with time. FIG. 3B shows the relation between the rotational angle θ of the rotary member and the elapsed time t, and indicates the convergence toward the limit value $ω_0/λ$.

Next, by using these equations, the corrected counter-electromotive force $V_c$ generated in the case where the rotational angular speed is constant at $\omega_1$ is determined by calculation from the counter-electromotive force $V_m$ measured at the measurement time $T_m$.

The rotational angular speed $d\theta/dt$ and the counter-electromotive force $V_m$ are proportional to each other with the torque constant $K_t$ as a proportionality constant, where the torque constant is the function of $\theta$ not dependent on the rotational angular speed $d\theta/dt$.

First, by substituting the result of Equation 2 into the rotational angular speed $d\theta/dt$, the counter-electromotive force $V_m$ is expressed as $$V_m = K_t \frac{d\vartheta}{dt} = K_t \omega_0 e^{-\lambda T_m} \qquad (3)$$

In similar fashion, in the case where the rotational angular speed is constant at $\omega_1$, the corrected counter-electromotive force $V_c$ is expressed as $$V_c = K_t \omega_1 \qquad (4)$$

The torque constant $K_t$ is equal for the same rotational angle $\theta$, and therefore from Equations 3 and 4 as simultaneous equations, $K_t$ is erased and $V_c$ is expressed as a function of $V_m$ and $T_m$ as follows.

$$V_c = V_m \frac{\omega_1}{\omega_0} e^{\lambda T_m} \qquad (5)$$

Also, the correction time $T_c$ representing the time before reaching the measured rotational angle $\theta$ due to the rotation at the constant rotational angular speed $\omega_1$ is given from Equation 2 as $$\vartheta = \omega_1 T_c = \frac{\omega_0}{\lambda}(1 - e^{-\lambda T_m}) \qquad (6)$$

from which the equation below is obtained.

$$T_c = \frac{\omega_0}{\lambda \omega_1}(1 - e^{-\lambda T_m}) \qquad (7)$$

Figure 4B:
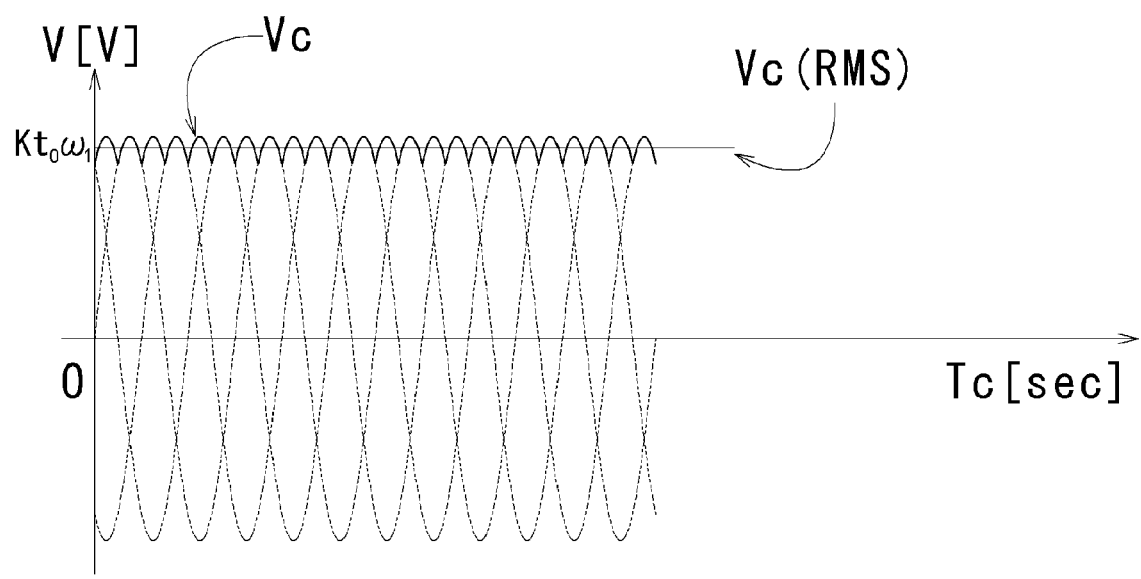
FIG. 4B is a graph showing the relation between the corrected potential difference and the corrected elapsed time.

FIG. 4B is a graph showing the relation between the corrected counter-electromotive force $V_c$ and the correction time $T_c$, where $V_c$ indicates a corrected rectified waveform in the case where the rotor is rotating at the constant rotational angular speed $\omega_1$. The square root $V_c$(RMS) of the root mean square of this rectified waveform is called the effective value and constant at $K_{t0} \cdot \omega_1$, where $\omega_1$ is an arbitrarily selected constant. Therefore, the torque constant (=counter-electromotive force constant) $K_{t0}$ can be accurately determined by calculating the effective value $V_c$(RMS) of $V_c$.

With regard to $\lambda$, the peak value of the measured counter-electromotive force $V_m$ is plotted at intervals of the measurement time $T_m$, and from the relation of Equation 3, the value $\lambda$ can be determined using the least squares approximation well known as a statistical data processing method.

The value $\lambda$ can be determined also using the least squares approximation from the effective value $V_m$(RMS) of the counter-electromotive force or the relation between the measured rotational angular speed calculated from the peak interval time of the potential difference $V_m$ and the measurement time $T_m$. Also, $\omega_0$ can be determined by substituting the measurement time T of one rotation of the motor 1 into Equation 2, as follows.

$$\omega_0 = \frac{2\pi\lambda}{(1 - e^{-\lambda T})} \qquad (8)$$

In other words, the corrected counter-electromotive force $V_c$ and the correction time $T_c$ in the case where the rotational angular speed $\omega_1$ is constant can be determined from the time $T_m$ and the counter-electromotive force $V_m$ which are measurements at the time of inertial rotation.

Incidentally, the correction calculation at the third step described above may be carried out concurrently with the data sampling at the second step.

1-4 Utilization of Measurement Data

The counter-electromotive force corrected to the operating conditions at the constant rotational speed obtained according to this embodiment can be used to determine the effective value of the counter-electromotive force constant $K_t$. Equation 4 shows the particular relation. By calculating the effective value of the corrected counter-electromotive force, the counter-electromotive force constant can be accurately determined. The counter-electromotive force constant $K_{t0}$ is substantially the same physical quantity as the torque constant of the motor. By determining this value accurately, the motor characteristics can be determined.

Also, each waveform of the inter-phase potential difference can be used for measurement of the total harmonics distortion ratio (THD) or the inter-modulation distortion ratio (IMD) by Fourier expansion.

Also, by predetermining the range of the parameter by measurement of a plurality of motor characteristics and determining whether the parameter range is satisfied or not at the time of measurement, whether the characteristics of the motor inspected are satisfactory or not can be determined.

1-5 Effects of the Embodiment

According to the embodiment of the invention described above, the counter-electromotive force $V_c$ for the rotational angular speed constant at $\omega_1$, can be determined simply by measuring the time $T_m$ and the associated counter-electromotive force $V_m$. Specifically, the equipment is less required and the cost is reduced. In addition, the number of measurement items is smaller, and the duplication of errors can be avoided, thereby making it possible to obtain a more accurate measurement value.

In determining the value $\lambda$ which is one of the internal parameters, a practically satisfactory accuracy can be achieved by six or more peaks of the measurement value $V_m$ of the counter-electromotive force. Specifically, one fourth of a rotation is enough for the motor having a magnet of eight magnetic poles and one half of a rotation for the motor having a magnet of four magnetic poles. In determining the value of another parameter $\omega_0$, on the other hand, a sufficient accuracy can be secured by taking the time required for one or half rotation of the motor.

In the motor having the steady rotational speed of 6,000 rpm, for example, only one hundredth of a second is required for one rotation immediately after deenergization, and even allowing for the margin of measurement time, the required time is about 0.1 second. Thus, the measurement process requires only a very short time.

In the miniature spindle motor 1 for rotating the hard disk according to the embodiment, for example, the deceleration and stop requires only less than one second without disk. Unlike in the conventional method incapable of accurate measurement, therefore, the method of the invention makes possible accurate measurement with a sufficient time allowance.

Also, in an application of the inspection method according to the invention to the measurement of the counter-electromotive force of a multiplicity of motors produced on the production line, an external forcible rotation device or a measurement disk having a large moment of inertia around the central axis of rotation is not specifically required. Thus, the rotary member is not damaged or fouled. Also, the number of steps and the time required for measurement are remarkably reduced, and therefore the productivity is improved.

Second Embodiment

Another inspection method according to a second embodiment of invention for the spindle motor 1 similar to the one used in the first embodiment is explained.

2-1 Spindle Motor and Energy Loss Thereof.

The configuration of the spindle motor 1 according to this embodiment is similar to that of the first embodiment. The energy loss characteristic is also similar.

Based on the result of study made in a similar manner to the first embodiment, therefore, the deceleration function is set as a function primarily proportional to the rotational angular speed.

2-2 Measurement of Counter-electromotive Force and Rotational Position

The measurement of the counter-electromotive force according to this embodiment, like in the first embodiment, uses the spindle motor 1 to be measured and a device (such as the digital oscilloscope or voltmeter) capable of temporally measuring the terminal potential difference. In addition, the signal output from a device (such as a Hall IC, FG sensor, magnetic or optical encoder) capable of temporally measuring the rotational position of the rotor of the spindle motor 1 is used. The rotational position measuring unit of the rotor may be built in the motor or an external device may be arranged out of contact as a measuring unit. Also, these data are more preferably digitally processed as a signal and output as a data. The data measured at minuscule time intervals are analyzed and processed in the computer to acquire the required various numerical values. A similar resolution can of course be obtained by either manual calculation and the computer.

As a first step, the drive circuit for controlling the current supplied to the coils 3b of the spindle motor 1 to be measured is turned on, and by connecting the coils 3b electrically to a power supply, the rotor is rotated at a predetermined rotational speed with respect to the stator.

As a second step immediately following the first step, the drive circuit for controlling the current supplied to the coils 3b is turned off, and the coils 3b and the power supply are disconnected electrically. Thus, the rotor is inertially rotated with respect to the stator, and during the gradual decrease in rotational speed, the angular position of the spindle motor 1 is measured at minuscule intervals of time by a rotational position measuring unit. Also, the signals are divided into two systems, while at the same time measuring the potential difference across the coils 3b of the spindle motor 1 at predetermined minuscule time intervals. According to this embodiment, the sampling rate is set to 50,000 Hz. In the case where the rotational speed is constant at 6,000 rpm, for example, 500 pieces of data can be sampled per rotation.

Next, as a third inspection step, the measurement value of the potential difference is corrected based the deceleration function determined earlier, and the value of the counter-electromotive force for the constant rotation mode at a specified rotational speed is determined.

As shown in the first embodiment, the loss torque of the spindle motor 1 is substantially proportional to the rotational speed, and therefore the deceleration function is set as a value (proportionality coefficient k) primarily proportional to the rotational angular speed $d\theta/dt$. Then, the rotational motion due to the rotation inertia of the rotor expressed by multiplying the moment of inertia I around the rotational axis by the rotational angular acceleration $d^2\theta/dt^2$ and the loss torque proportional to the rotational angular speed $d\theta/dt$ is taken into account. Thus, the equation of motion during the inertial rotation of the motor rotor is given as $$\frac{d^2\theta}{dt^2} = -\lambda \frac{d\theta}{dt} \tag{1}$$

where $\lambda$ is the ratio between the moment of inertia I around the rotational axis and the proportionality coefficient k ($\lambda$=k/I). Setting the boundary conditions as $\theta$=0 and $d\theta/dt=\omega_0$ for t=0, this differential equation is resolved as follows.

$$\frac{d\theta}{dt} = \omega_0 e^{-\lambda t}, \quad \theta = \frac{\omega_0}{\lambda}(1 - e^{-\lambda t}) \tag{2}$$

Into this equation, a multiplicity of data of the time t and the angle $\theta$ measured by the rotational position measuring unit are input, and the values $\omega_0$ and $\lambda$ are determined by the least square method providing a statistical data processing method.

Then, the counter-electromotive force $V_m$ measured at the measurement time $T_m$ and the above-mentiond $\omega_0$ and $\lambda$ are input to Equation 5 described in the first embodiment. In this way, the corrected counter-electromotive force $V_c$ generated with a constant rotational angular speed $\omega_1$ can be calculated.

The motor according to this embodiment has the same specification as that of the first embodiment, and therefore the measurement amount and the values obtained by correction are also similar.

The rotational position and the terminal potential difference, which are measured at the same time at the second inspection step in the aforementioned method, may alternatively be measured separately from each other. Also, in the case where the temporal change data on the rotational position is sampled and used as a basis for determining the deceleration function before application of this inspection method, the inspection accuracy can be further improved.

2-3 Utilization of Measurement Data

Also from the counter-electromotive force obtained by this method, like in the first embodiment, various physical quantities indicating the motor characteristics can be determined. The acceptability can be determined also by measuring a plurality of motor characteristics and thus determining the range of a parameter in advance, and then by determining whether the range of the particular parameter is met at the time of measurement.

2-4 Effects of this Embodiment

According to this embodiment of invention, like in the first embodiment, the measurement time can be shortened.

In the case where the motor has a signal output for detecting the rotational position, the use of the signal output makes possible more accurate measurement of the counter-electromotive force. Also, in the case where the deceleration is quick or the deceleration function is complicated, the allowable range is widened.

Other Embodiments

This invention is not limited to the embodiments described above, and variously modifiable without departing from the scope and spirit of the invention.

The motor to which the invention is applicable is not limited to the spindle motor for the hard disk drive, but can be used also as the spindle motors for rotating the recording disks such as the optical disk, magnetic disk and magnetooptic disk. The invention is also applicable to the multi-purpose motor and various motors for home electric appliances, on-vehicle devices, optical devices and information equipment. The applicable motors are not limited to the brushless DC motor, but include the AC servo motor, DC brush motor and any other motors having a permanent magnet and coils in opposed relation to the permanent magnet. Further, the coils are not necessarily required to be wound on the iron core, but the coreless motor, axial gap motor, etc. can also be used with equal effect. In applications to the motors (having the impeller or propeller mounted thereon) used for the fan or the pump greatly affected by the windage loss, however, the effects of the rotation resistance are varied depending on the operating conditions, and therefore the measurement is required to be confirmed and the proper deceleration function prepared in advance.

In the case where the rotation resistance is proportional to the square or cube of the rotational angular speed, the process based on a similar concept is possible by taking the effects of the secondary or higher perturbation into account, although the numerical calculations and the data processing are somewhat complicated. The equation of motion including resistance may require a multiplicity of parameters. In such a case, preferably, many measurement data are collected and the parameters are determined from them. In some cases, these parameters can be used more advantageously for calculations by being averaged in advance as a motor design value.

The deceleration function should be determined based on resistance after some prediction by simulation, torque measurement and analysis calculations. In the case of a motor having a large loss which cannot be maintained in normal rotation and stopped in less than ten rotations after switching off power, the invention may not be applicable.

Also, the values $\omega_0$ and $\lambda$ may be determined in advance and the terminal potential may be corrected based on these values. Further, the physical quantities other than the counter-electromotive force may be measured by the method according to the invention. Specifically, in the case where the motor having a correlation between rotational speed and rotation resistance, the inspection method according to the invention is applicable for the measurable variables such as the counter-electromotive force or torque.

Thus, all the modifications not departing from the true spirit and scope of the invention are included in the cope of claims appended hereto.

What is claimed is:

1. A method of inspecting a plurality of motors having substantially the same structure each including a permanent magnet and coils wound with coil lead wires, which selected one of the permanent magnet and the coils constitutes a stator, and the other constitutes a rotor adapted to rotate with respect to the stator, wherein a relation between an elapsed time and a reduction in rotational speed during an inertial rotation is measured or estimated thereby to determine a deceleration function of at least one of the motors, the method comprising:

a first step for electrically connecting terminals of the coil lead wires and a power supply for each of the motors, and rotating the rotor at a predetermined rotational speed with respect to the stator;

a second step for inertially rotating the rotor with respect to the stator by electrically disconnecting the coil lead wires and the power supply immediately after the first step, and measuring a potential difference across the coil lead wires during the inertial rotation; and a third step for correcting the value of the potential difference generated during the constant rotation at each of a plurality of predetermined rotational speeds by corrective calculation of a measurement value of the potential difference based on the deceleration function.

2. The motor inspection method according to claim 1, wherein the permanent magnet is annular and, assuming that the relative rotational angular position of the rotor with reference to the coils is θ, the time elapsed from the reference time is t, and a rotation resistance for reducing the rotational speed during the inertial rotation is primarily proportional to a rotational angular speed of the motor, then the deceleration function is defined as a right side of Equation 1 that a proportionality constant thereof is $\lambda$ $$\frac{d^2 \vartheta}{dt^2} = -\lambda \frac{d\vartheta}{dt} \tag{1}$$

and the measurement value of the potential difference is applied to a resolution of Equation 1 and thus corrected to the value of the potential difference generated during the constant rotation at each of a plurality of predetermined rotational speeds.

3. The motor inspection method according to claim 2, wherein parameters required for the correction are determined for each motor to be measured, by the elapsed time and the prevailing measurement value of the potential difference.

4. The motor inspection method according to claim 3, wherein a change rate, with respect to the elapsed time, of a plurality of local maximum values and/or local minimum values or effective values of the potential difference measured at minuscule time intervals is calculated using a statistical data processing means thereby to determine a parameter $\lambda$ of the deceleration function.

5. The motor inspection method according to claim 4, wherein the motor used for inspection is a DC brushless motor configured of the stator including an iron core having a plurality of magnetic pole teeth and the coils wound on each of the magnetic pole teeth, and the rotor including the annular permanent magnet having a plurality of diametrically magnetized magnetic poles in diametrically opposed relation to the magnetic pole teeth, and the current supplied to the coil lead wires is controlled by a drive circuit.

6. The motor inspection method according to claim 5, wherein the rotor of the motor used for inspection has mounted thereon a rotor hub formed with a discal recording medium mounting surface, and the rotor is supported on the stator through fluid dynamic bearings.

7. The motor inspection method according to claim 6, wherein the motor used for inspection has a rated rotational speed of not more than 20,000 rpm, and a diameter of a discal recording medium mounted on the rotor hub is not more than 2.5 inches.

8. The motor inspection method according to claim 4, wherein in the second step, a counter-electromotive forces having two or three different phases are generated in the coils, that one of the counter-electromotive forces generated in the coil at the same time which has a maximum absolute value is output as a rectified waveform by a rectification circuit and the rectified waveform is used as a measurement value of the counter-electromotive force.

9. The motor inspection method according to claim 8, wherein the motor used for inspection is a DC brushless motor configured of the stator including an iron core having a plurality of magnetic pole teeth and the coils wound on each of the magnetic pole teeth, and the rotor including the annular permanent magnet having a plurality of diametrically magnetized magnetic poles in diametrically opposed relation to the magnetic pole teeth, and the current supplied to the coil lead wires is controlled by a drive circuit.

10. The motor inspection method according to claim 9, wherein the rotor of the motor used for inspection has mounted thereon a rotor hub formed with a discal recording medium mounting surface, and the rotor is supported on the stator through fluid dynamic bearings.

11. The motor inspection method according to claim 10, wherein the motor used for inspection has a rated rotational speed of not more than 20,000 rpm, and a diameter of a discal recording medium mounted on the rotor hub is not more than 2.5 inches.

12. The motor inspection method according to claim 2, the motor including a rotational position measuring unit for detecting the relative rotational positions of the rotor and the stator, wherein:
in the second inspection step, the elapsed time and the prevailing rotational position are measured at the same time during the inertial rotation of the rotor; and
in the third inspection step, the resolution obtained from Equation 1 is analyzed by the statistical data processing method using the elapsed time and the rotational position measurement value thereby to determine the parameter required for correction for each motor to be measured.

13. The motor inspection method according to claim 12, wherein in the second step, the counter-electromotive forces having two or three different phases are generated in the coils, that one of the counter-electromotive forces generated in the coils at the same time which has the maximum absolute value is output as a rectified waveform by a rectification circuit, and the rectified waveform is used as a measurement value of the counter-electromotive force.

14. The motor inspection method according to claim 13, wherein the motor used for inspection is a DC brushless motor configured of the stator including an iron core having a plurality of magnetic pole teeth and the coils wound on each of the magnetic pole teeth, and the rotor including the annular permanent magnet having a plurality of diametrically magnetized magnetic poles in diametrically opposed relation to the magnetic pole teeth, and the current supplied to the coil lead wires is controlled by a drive circuit.

15. The motor inspection method according to claim 14, wherein the rotor of the motor used for inspection has mounted thereon a rotor hub formed with a discal recording medium mounting surface, and the rotor is supported on the stator through fluid dynamic bearings.

16. The motor inspection method according to claim 15, wherein the motor used for inspection has a rated rotational speed of not more than 20,000 rpm, and a diameter of a discal recording medium mounted on the rotor hub is not more than 2.5 inches.

17. The motor inspection method according to claim 1, the motor including a rotational position measuring unit for detecting relative rotational positions of the rotor and the stator, wherein:
in the second inspection step, the elapsed time and the prevailing rotational position are measured at the same time during the inertial rotation of the rotor; and
in the third inspection step, the rotational angular speed and the rotational angular acceleration are calculated from the elapsed time and the rotational position measurement value, and analyzed by the statistical data processing method thereby to determine the deceleration function and the parameter required for specifying the deceleration function for each motor to be measured.

18. The motor inspection method according to claim 17, wherein in the second step, the counter-electromotive forces having two or three different phases are generated in the coils, that one of the counter-electromotive forces generated in the coils at the same time which has the maximum absolute value is output as a rectified waveform by a rectification circuit, and the rectified waveform is used as a measurement value of the counter-electromotive force.

19. The motor inspection method according to claim 18, wherein the motor used for inspection is a DC brushless motor configured of the stator including an iron core having a plurality of magnetic pole teeth and the coils wound on each of the magnetic pole teeth, and the rotor including the annular permanent magnet having a plurality of diametrically magnetized magnetic poles in diametrically opposed relation to the magnetic pole teeth, and the current supplied to the coil lead wires is controlled by a drive circuit.

* * * * *